United States Patent [19]
Choi

[11] Patent Number: 6,043,723
[45] Date of Patent: Mar. 28, 2000

[54] LOAD LINE TYPE PHASE DISPLACEMENT UNIT

[75] Inventor: Byung-Hwan Choi, Seoul, Rep. of Korea

[73] Assignee: Hyundai Electronics Industries Co., Ltd., Rep. of Korea

[21] Appl. No.: 09/020,058

[22] Filed: Feb. 6, 1998

[30] Foreign Application Priority Data

Feb. 6, 1997 [KR] Rep. of Korea .......................... 97-3723

[51] Int. Cl.⁷ ...................................................... H03H 7/18
[52] U.S. Cl. ............................................. 333/161; 333/164
[58] Field of Search .................................... 333/156, 161, 333/164

[56] References Cited

U.S. PATENT DOCUMENTS

| 4,951,008 | 8/1990 | Vedrenne et al. .................. 333/164 X |
| 4,999,596 | 3/1991 | Nakatani et al. ......................... 333/204 |

FOREIGN PATENT DOCUMENTS

| 61-273001 | 12/1986 | Japan ..................................... 333/161 |
| 62-82801 | 4/1987 | Japan ..................................... 333/161 |
| 63-224501 | 9/1988 | Japan ..................................... 333/161 |

OTHER PUBLICATIONS

Hayt, Jr., *Engineering Electromagnetics*, McGraw–Hill, pp. 440 & 454, 1981.

*Primary Examiner*—Justin P. Bettendorf
*Attorney, Agent, or Firm*—Lawrence G. Kurland, Esq.; Bryan Cave LLP

[57] ABSTRACT

A load line type phase displacement unit which is capable of reducing the time which is required for designing the system and increasing the system fabrication efficiency by simply adjusting a phase difference of an input signal by adjusting the length of a stub after the impedances of a main line and a stub are made identical with a characteristic impedance. The unit a main line unit having a main line having a characteristic impedance $Z_0$ and an identical impedance $Z_c$ and a plurality of stubs having an impedance $Z_c$ of the main line and an identical impedance and being capable of changing a phase difference of an input signal, and a sub-line unit having a stub having an impedance which is identical with the characteristic impedance $Z_0$ of the main line and a sub-line which is connected in parallel with the stub for compensating for error information based on the malfunction of the main line unit.

4 Claims, 1 Drawing Sheet

LOAD LINE TYPE PHASE DISPLACEMENT UNIT

BACKGROUND OF THE INVENTION

1. Field of the Invention

The present invention relates to a load line type phase displacement unit, and in particular, to an improved load line type phase displacement unit which is capable of reducing the time which is required for designing the system and of increasing system fabrication efficiency by simply adjusting a phase difference of an input signal by adjusting the length of a stub after the impedances of a main line and a stub are made identical with a characteristic impedance.

2. Description of the Prior Art

Generally, in accordance with the recommendation by IEEE, a dynamic phase arrangement antenna is provided with a phase displacement unit of a main line in accordance with a method for controlling a steering direction and position of an antenna beam in a Ka band width (for example, 27~40Ghz) among microwave bands.

The above-described phase displacement unit of a main line in accordance with the IEEE recommended method is implemented by varying the impedance of the main line and adjusting the length and impedance of a stub.

However, in the conventional phase displacement unit, since the impedance of the main line, the impedance of the stub and the impedance of the input signal are not identical, in a T-junction portion, namely, in the millimeter wave in which the electrical characteristic of the portion where the characteristic impedance and the impedance of the main line are different ($Z_0 \neq Z_c$), the decoding of the non-continuity is not made easily.

In addition, since it is impossible to minimize the parasitic components, the malfunction may occur in the Ka band width, and the resonant phenomenon may occur in the electrical characteristic of a switching device and micro strip. Furthermore, a big insertion loss and a phase error may occur due to the loss in a predetermined frequency band width of a design specification.

SUMMARY OF THE INVENTION

Accordingly, it is an object of the present invention to provide an improved load line type phase displacement unit which overcomes the aforementioned problems encountered in the prior art.

It is another object of the present invention to provide an improved load line type phase displacement unit which is capable of reducing the time which is required for designing the system, enhancing performance and fabrication efficiency and overcoming an insertion loss by making the phase difference of an input wave be different by adjusting the length of the main line and the length of a stub, which is a load line connected in parallel with the main line after making the impedance of the main line, and by making the impedance of the stub and the characteristic impedance identical with each other, thus minimizing the parasitic component.

In order to achieve the above objects, there is provided a load line type phase displacement unit which includes a main line unit having a main line having a characteristic impedance $Z_0$ and an identical impedance $Z_c$, and a plurality of stubs having an impedance $Z_c$ of the main line and an identical impedance and changing a phase difference of an input signal, and a sub-line unit having a stub having an impedance which is identical with the characteristic impedance $Z_0$ of the main line and a sub-line which is connected in parallel with the stub for compensating for error information based on the malfunction of the main line unit.

In order to compensate error information based on a malfunction based on a fabrication of a main line, there is provided a sub-line provided with a stub having an impedance identical with the characteristic impedance which corresponds to the structure of the main line.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
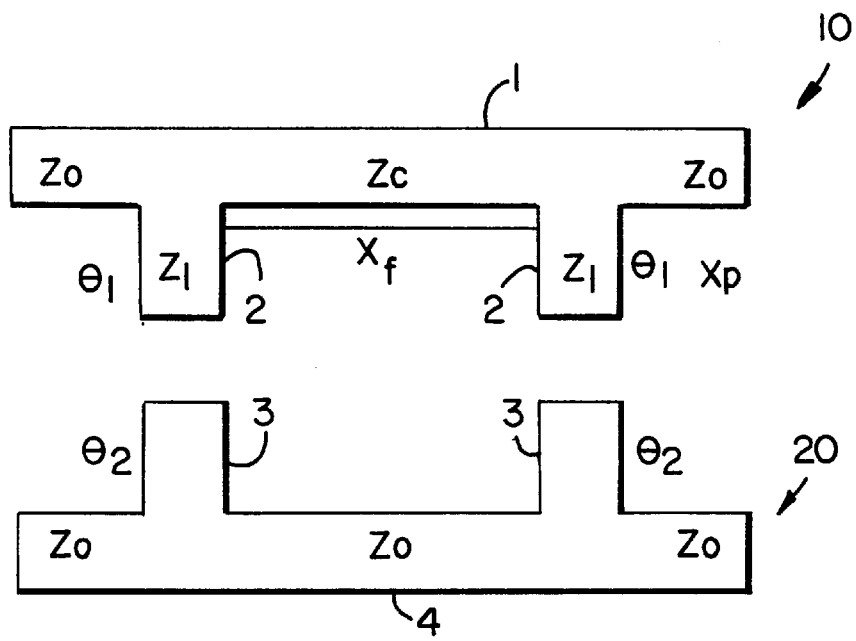
FIG. 1 is a diagrammatic view illustrating the construction of a load line type phase displacement unit according to the present invention.
Figure 2:
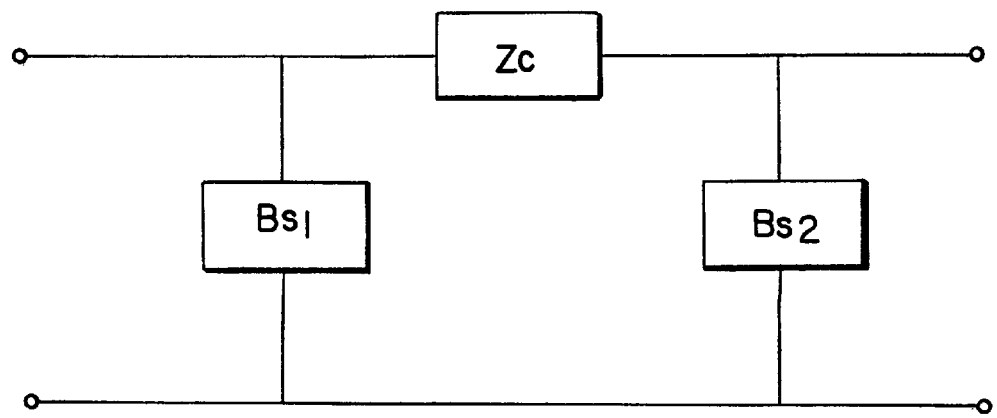
FIG. 2 is a circuit diagram partially in block illustrating a load line type phase displacement unit according to the present invention.

Referring now to the drawings in detail, and initially to FIG. 1, FIG. 1 illustrates the construction of a load line type phase displacement unit according to the present invention, and FIG. 2 illustrates circuit diagram of the load line type phase displacement unit of FIG. 1 according to the present invention.

As shown therein, the load line type phase displacement unit according to the present invention includes a main line unit 10 composed of a plurality of vertically connected stubs 2 which are integrally connected with a horizontal main line 1 in a π-shape, and a sub-line unit 20 composed of a plurality of vertically connected stubs 3 which correspond with the main line unit 10 and are integral with the horizontal sub-line 4.

The operation of the load line type phase displacement unit according to the present invention will be explained further herein with reference to the accompanying drawings.

First, in the load line type phase displacement unit of FIG. 1, the impedance $Z_c$ of the main line 1, the characteristic impedance $Z_0$ and the impedance $Z_1$ of the stub 2 are set to be identical, and the impedance of the sub-line 4, the impedance of the stub 3 connected with the sub-line 4 and the characteristic impedance $Z_0$ are set to be identical.

In such an arrangement, after the impedance $Z_c$ of the main line 1, the characteristic impedance $Z_0$ and the impedance $Z_1$ of the stub 2 are made identical, it is possible to change the phase difference of the input wave by adjusting the electric length of the stub 2, namely, the load.

In addition, when implementing the phase displacement unit of the present invention using an aperture coupling feed structure, which is a kind of the indirect feed structure, not a direct feed structure, it is possible to overcome any ground problem of the switching device of the phase displacement by enabling an easy connection with the ground, and it is possible to compensate for any the malfunction of the system by providing the sub-line unit 20 corresponding to the main line unit 10.

Generally the fabrication error, namely, the line width of, for example, 1 mil (1/1000 inches) is not implemented during its fabrication. Even when such line width is possible, it is impossible to enable a uniform line width. Here, as a result of the design, the difference which occurs during the fabrication is called a malfunction.

In addition, it is possible to improve the impedance matching characteristic of the load line type phase displacement according to the present invention by adjusting the impedance of the sub-line 4 and the impedance of the stub 3.

Referring now to FIG. 2, FIG. 2 illustrates the circuit diagram of a load line type phase displacement of FIG. 1 according to the present invention. As shown therein, the $B_{s1}$ and $B_{s2}$ are connected in parallel, which determine the length of the stub 2 with respect to the impedance $Z_c$ of the main line 1.

When setting the impedance $Z_1$ of the stub 2 and the characteristic impedance $Z_0$ of the main line 1 to be identical, the width of the line becomes identical. The length of each stub 2 with respect to the impedance $Z_1$ is determined by the $B_{s1}$ and $B_{s2}$. At this time, the length of the stub and the value corresponding to the width are obtained by the following sit of equations:

$$B_{s1} = Y_0 \frac{[(X_p + X_f)\tan\theta_1 - Z_0]}{[(X_p + X_f) + Z_0\tan\theta_1]}$$

$$B_{s2} = Y_0 \frac{[(X_p + X_r)\tan\theta_1 - Z_0]}{[(X_p + X_r) + Z_0\tan\theta_1]}$$

$$X_p = -Z_0 \cot\theta_2$$

$$X_p^2 + X_p(X_f + X_r) + \frac{(X_f - X_r)(B_{s1}B_{s2}Z_0^2 + 1)}{(B_{s2} - B_{s1})} + Z_0^2 + X_f X_r = 0$$

$$\theta_1 = \tan^{-1}\left[\frac{[1 + B_{s1}(X_p + X_f)]Z_0}{(X_f + X_p) - B_{s1}Z_o^2}\right]$$

$$\theta_1 = \tan^{-1}\left[\frac{[1 + B_{s2}(X_p + X_f)]Z_0}{(X_f + X_p) - B_{s2}Z_o^2}\right]$$

where $Y_0$ denotes the reverse value of the characteristic impedance $Z_0$, $X_r$ denotes a reactance value in the reverse bias state of the switching device and the phase values of $\theta_1$ and $\theta_2$ which determine the length of the stub.

In addition, $X_f$ denotes the reactance value of the width component between a plurality of stubs 2, and $X_p$ denotes the reactance value of the length component of the stub 2.

As described above, it is possible to more easily decode the non-continuity of the T-junction by varying the length of the stub 2 connected with the main line 1 and to shorten the time which is required to design the system by about 40% by eliminating the malfunction factors.

In addition, it is possible to improve the impedance matching of the phase displacement unit based on the sub-line structure and increase the fabrication efficiency by connecting the switching devices to the identical lines and the ground.

Furthermore, in the phase arrangement antenna of Ka band width, it is possible to randomly control the system by electrically controlling the steering direction of the beam, the system may be light, and the system has a high resolution capability, and it is possible to change the position of the beam to a predetermined position at a high speed.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A load line type phase displacement unit, comprising:

a main line unit comprising a main line having a characteristic impedance $Z_0$ and an identical impedance $Z_c$ and a plurality of main line stubs having said impedance $Z_c$ of said main line and an identical impedance and being capable of changing a phase difference of an input signal; and a sub-line unit comprising a plurality of sub-line stubs having an impedance which is identical with said characteristic impedance $Z_0$ of said main line and a sub-line which is connected in parallel with said sub-line stubs for compensating for error information based on a malfunction of the main line unit, wherein said main line stub has an associated length value, said length values of said main line stub with respect to the impedance being determined by the following equations $B_{s1}$ and $B_{s2}$ when the impedance $Z_1$ and the characteristic impedance $Z_0$ are identical;

$$B_{s1} = Y_0 \frac{[(X_p + X_f)\tan\theta_1 - Z_0]}{[(X_p + X_f) + Z_0\tan\theta_1]}$$

$$B_{s2} = Y_0 \frac{[(X_p + X_r)\tan\theta_1 - Z_0]}{[(X_p + X_r) + Z_0\tan\theta_1]}$$

where, $Y_0$ denotes the reverse value of the characteristic impedance $Z_0$, $X_r$ denotes a reactance value in the reverse bias state of a switching device, $X_f$ denotes the reactance value of the width component between a plurality of main line stubs, and $X_p$ denotes the reactance value of the length component of the main line stubs.

2. The unit of claim 1, wherein said main line stub is formed in parallel, perpendicularly with said main line.

3. The unit of claim 1, wherein said sub-line stub and said sub-line of said sub-line unit are perpendicularly formed.

4. The unit of claim 1, wherein said switching device is positioned between said main line stubs and a ground.

* * * * *